United States Patent [19]

Bletz et al.

[11] Patent Number: 4,737,668
[45] Date of Patent: Apr. 12, 1988

[54] CIRCUIT ARRANGEMENT FOR REDUCING THE SETTLING TIME OF LOGARITHMIC AMPLIFIERS

[75] Inventors: Walter Bletz, Braunfels; Rolf Magel, Fernwald; Helmut Bill, Wetzlar-Naunheim, all of Fed. Rep. of Germany

[73] Assignee: Ernst Leitz Wetzlar GmbH, Wetzlar, Fed. Rep. of Germany

[21] Appl. No.: 911,862

[22] Filed: Sep. 26, 1986

[30] Foreign Application Priority Data

Sep. 30, 1985 [DE] Fed. Rep. of Germany ....... 3534808

[51] Int. Cl.$^4$ .......................... H03K 5/00; H03K 3/42; H03K 17/56; G06G 7/24
[52] U.S. Cl. ................................... 307/542; 307/543; 307/549; 307/492; 307/311; 307/542.1; 328/145
[58] Field of Search ............ 330/59, 308; 250/214 A, 250/214 L, 214 R; 307/490, 491, 492, 311, 542, 543, 547, 311, 549, 247 A; 354/416, 417; 328/145

[56] References Cited

U.S. PATENT DOCUMENTS 4,188,551 2/1980 Iwasaki et al. .................. 250/214 A
4,639,134 1/1987 Bletz ..................................... 330/308

Primary Examiner—Stanley D. Miller
Assistant Examiner—Trong Quang Phan
Attorney, Agent, or Firm—Schwartz, Jeffery, Schwaab, Mack, Blumenthal & Evans

[57] ABSTRACT

A circuit arrangement for reducing the settling time of amplifiers to which photoelectronic components are connected. A control circuit is provided which, operating in conjunction with components of this circuit arrangement, prevents the parasitic capacitance of the photoelectronic component from being charged up when the circuit arrangement is connected to the operating voltage.

14 Claims, 5 Drawing Sheets

CIRCUIT ARRANGEMENT FOR REDUCING THE SETTLING TIME OF LOGARITHMIC AMPLIFIERS

BACKGROUND OF THE INVENTION

The invention relates to a circuit arrangement for reducing the settling time of logarithmic amplifiers to which photoelectronic components are connected.

Logarithmic amplifiers having currents supplied by photodiodes generally have switch-on problems when the photodiode currents are very small. This is becuase settling processes occurring during switch-on have the effect, in conjunction with the rectifier characteristics of the logarithmic diodes which are connected to these amplifiers, that voltage peaks fully reach the photodiodes in one polarity; but in the other polarity the logarithmic diodes completely block the peaks. As a result, the photodiode is charged up in the wrong direction. Recharging can only be done by the very small photocurrent since the photodiodes and the logarithmic diodes block up to a very high voltage. In most cases, the photodiodes have a considerable capacitance so that a long, undesirable time elapses for the recharging. Due to this "false charge", the output of the amplifier is latched up to a particular but undesired value for a certain time after switch-on. This is why such a circuit arrangement does not amplify the current detected and indicates a small amount of light and does not work normally unitl the "false charge" across the photoelectronic component has been removed.

To reduce the effect of this switch-on time, it has ben proposed in German Offenlegungsschrift No. 2,833,217 (incorporated herein by reference) to supply the input of an amplifier following the photolectronic component with an auxiliary voltage via a differentiating section.

Circuit arrangements of this type must meet extreme requirements with respect to residual currents and are therefore of elaborate technical construction or present problems for reasons of stability. In addition, correct indication of the current measured by the arrangement is not possible immediately after switching on the operating voltage.

To acheive a simpler construction of such a circuit arrangement in which a differential amplifier is connected together with a photodiode, and its output is fed back via a logarithmic diode to the inverting input, it is proposed in German Offenlegungsschrift No. 3,113,220 (incorporated herein by reference) "to reduce" the feedback current flowing via the logarithmic diode in the settling phase of the input stage by connecting the output of the differential amplifier to ground potential during a limited switched-on period.

It is a disadvantage also in this case that no indication can be derived from the exposure control circuit immediately after the operating voltage is applied to the circuit arrangement and then, despite the reduction of the feedback current flowing via the logarithmic diode, a settling phase can occur until the operating point is reached, which again causes the same problem of false charging.

SUMMARY OF THE INVENTION

The present invention has the object, therefore, of specifying a circuit arrangement for reducing the settling time of amplifiers to which photoelectronic components are connected. The invention utilizes a simple construction wherein the charging-up of the photoelectronic component with a false charge is prevented or this charge is removed, and thus, an exposure control circuit equipped with the circuit is able to supply faultless measurement values which can be immediately provided after switch-on and immediately indicated.

For a circuit arrangement of the type initially specified, the object is achieved by the fact that control means are contained which, operating in conjunction with components of the circuit arrangement, prevent the false charging of the photoelectronic component when the circuit arrangement is connected to the operating voltage, by slowly enabling the amplifier when the vicinity of the operating point is reached and preventing oscillation. Another solution consists in the fact that the false charge can be rapidly removed at the start by means of a connected circuit.

BRIEF DESCRIPTION OF THE DRAWINGS

The invention is diagrammatically represented in illustrative embodiments in the drawing and described in closer detail in the text which follows.

DETAILED DESCRIPTION OF THE PREFERRED EMBODIMENTS

Figure 1:
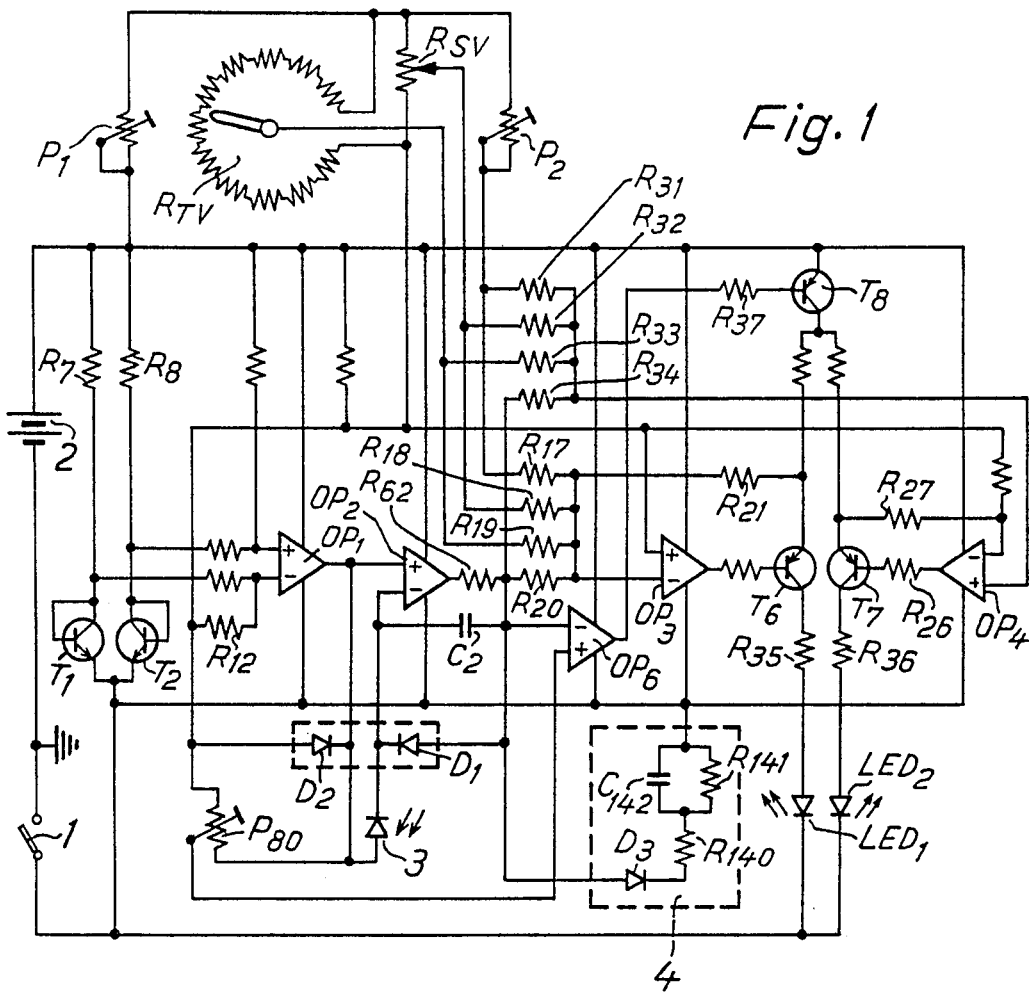
FIG. 1 shows a circuit arrangement according to the invention in conjunction with an exposure measuring circuit.

An embodiment of the circuit arrangement in accordance with the invention is shown in FIG. 1. The circuit comprises an operational amplifier $OP_2$ acting as a current/voltage converter, and a non-linear component (a logarithmic diode $D_1$). The non-linear component converts a current derived by the photodiode from the brightness of the scene into a logarithmic voltage. A current source 2 is switchd on by means of a switch 1. This connects diode-connected transistors $T_1$ and $T_2$ to the supply voltage from which they are supplied with different currents via resistors $R_7$ and $R_8$. The differential voltage resulting from these currents is amplified in an operational amplifier $OP_1$ with feedback via a resistor $R_{12}$. The output of the operational amplifier $OP_1$ connected to one terminal of a temperature compensation stage $D_2$, the other terminal of which is connected via the feedback resistor $R_{12}$ to the input of operational amplifier $OP_1$ and to variable resistors $P_1$, $P_2$, $R_{SV}$ and $R_{TV}$.

The logarithmic stage consisting of non-linear component $D_1$ and operational amplifier $OP_2$ and the taps of the variable resistors $P_1$, $P_2$, $R_{SV}$ and $R_{TV}$ are followed by at least one operational amplifier $OP_3$ via resistors $R_{17}$ to $R_{20}$. The operational amplifier $OP_3$ is a part of a calculating stage which also comprises a feedback resistor $R_{21}$ which is located between the emitter of a switching transistor $T_6$ and the sum point of the resistors $R_{17}$ to $R_{20}$. In addition, a circuit stage (comprising operational amplifier $OP_4$ and resistors $R_{31}$–$R_{34}$, $R_{27}$) following the output of the operational amplifier stage $OP_3$ in the opposite direction is also provided.

If highly-sensitive films are used, exposure times can still be measured which are obtained with a very low scene brightness. Thus, in photodiode 3, currents are produced which are in the pico-ampere range and which, in practice, can no longer be reliably processed.

This results in errors in the measurement of the scene brightness and, as a result, in wrongly exposed photos. To prevent this from happening, the output of the operational amplifier $OP_2$ acting as a current/voltage converter is connected to the inverting input of a comparator $OP_6$ with the aid of which light-emitting diodes $LED_1$ and $LED_2$ located at the outputs of the calculating stage and of the follower stage are switched off when the luminance of the object to be measured drops below a limit value.

At the non-inverting input of the comparator $OP_6$, a potentiometer $P_{80}$ is located for this purpose. The voltage tapped off at this potentiometer $P_{80}$ serves for switching-off the indication of the exposure meter, i.e., the light-emitting diodes $LED_1$ and $LED_2$.

The switching off is effected by the output of the comparator $OP_6$ being connected to the base of a transistor $T_8$ via a resistor $R_{37}$. If the comparator $OP_6$ responds, its output goes to a positive potential. As a result, the transistor $T_8$ is not conducting and no current flows to the light-emitting diodes $LED_1$ and $LED_2$.

When the operating voltage is applied to the circuit arrangement, a settling process can occur at the operational amplifier $OP_2$ in consequence of which its output assumes the "+" supply value for a brief time. If this is the case, the capacitance of the photodiode 18 is recharged via the non-linear element $D_1$ in such a manner that a positive charge is present at the inverting input of the operational amplifier $OP_2$. This charge will not decay on its own since both the inverting input of the operational amplifier $OP_2$ and the photodiode 18 and the non-linear element $D_1$ have a very high impdance in the reverse direction.

At the output of the operational amplifier $OP_2$ there is then a very low potential as a result of which the comparator $OP_6$ switches off the indication from the lighteneitting diode $LED_1$ and $LED_2$. Since in the lower range of luminance the photocurrent available for recharging the photodiode 18 is only low, the indication remains initially switched off.

Figure 11:
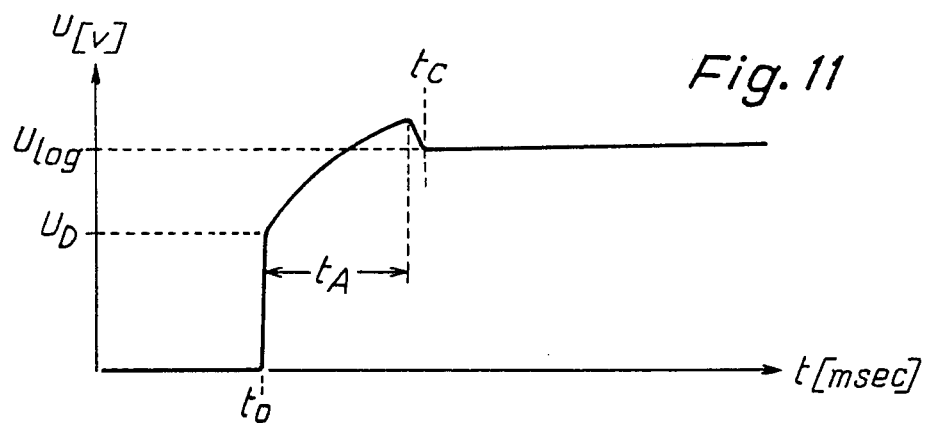
FIG. 11 shows a diagram of the signal variation with time at the anode of a logarithmic diode.

This "failure" in time is prevented by a circuit section 4, located at the output of the operational amplifier $OP_2$, via resistor $R_{62}$, and consisting of diode $D_3$, resistor $R_{140}$ and the RC section consisting of resistor $R_{141}$ and capacitor $C_{142}$. When the operating voltage is switched on, the logarithmic diode $D_1$ is prevented by the capacitor $C_{142}$ via the diode $D_3$ and the resistor $R_{140}$ from suddenly going to a positive voltage. Since, as a result of this buffering, this can only happen gradually, the opertional amplifier $OP_2$ has time to settle as is shown in FIG. 11. This figure shows the signal variation with time at the anode of the logarithmic diode $D_1$. A resistor $R_{62}$ at the output of $OP_2$ is used for intercepting the voltage peaks occurring there in any case.

FIG. 11 represents the case that the operating voltage is switched on at time $t_o$. When the voltage $U_D$ is reached at diode $D_3$, the latter conducts. The capacitor $C_{142}$ charges up during time $t_A$ so that the operational amplifier $OP_2$ is slowly able to approach its operating point. This process is completed at time $t_c$ at which the voltage $U_{10g}$ at the anode of diode $D_1$ has become constant.

The element not designated and described in greater detail in this and the subsequent circuits represent the usual circuit measures which can be found in the data sheets of the operational amplifiers and transistors used.

Figure 2:
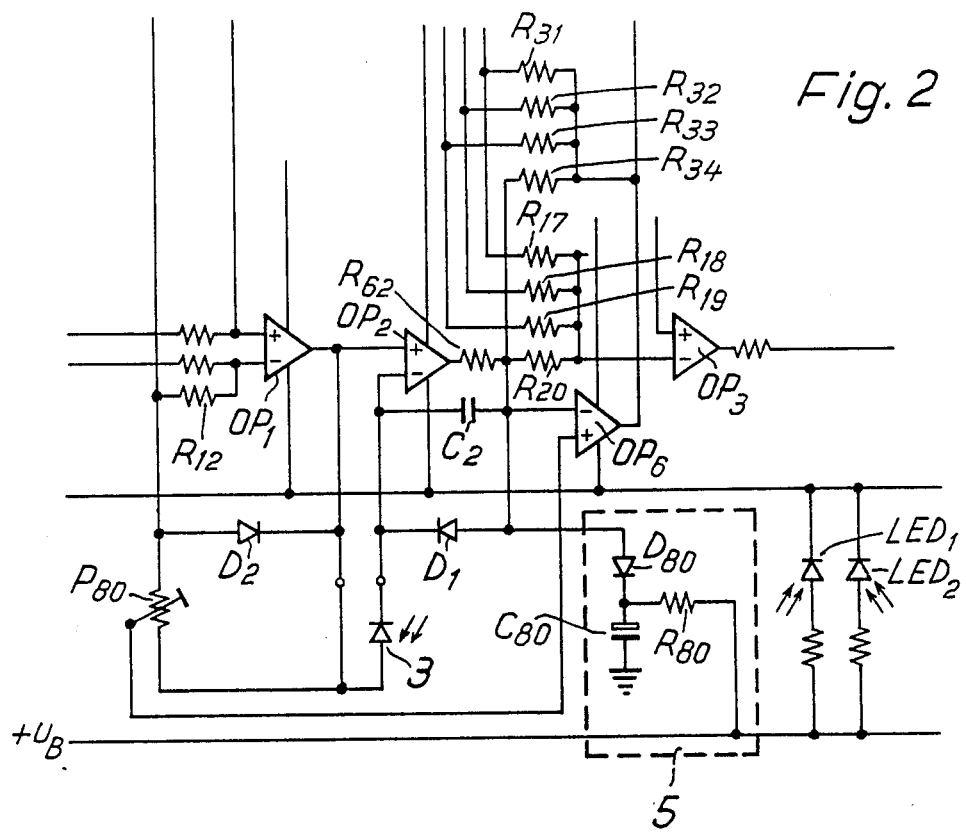
FIG. 2 to FIG. 10 show further illustrative embodiments of such a circuit arrangment.

In the illustrative embodiment of FIG. 2, a circuit section 5 consisting of a blocking diode $D_{80}$ and a capacitor $C_{80}$, which is connected in series with this diode and is connected to ground, is located at the output of the operational amplifier $OP_2$ in addition to the resistor $R_{62}$, already shown in FIG. 1. Between the diode $D_{80}$ and the capacitor $C_{80}$, a resistor $R_{80}$ is connected which is connected to the operating voltage.

When the circuit arrangement is connected to the operating voltage, the voltage peak present at the output of the operational amplifier $OP_2$ is short-circuited via the resistor $R_{62}$, the blocking diode $D_{80}$ and the capacitor $C_{80}$. This is followed by the capacitor $C_{80}$ being charged to the operting voltage via the resistor $R_{80}$. As a result, the blocking diode $D_{80}$ then blocks and the operational amplifier $OP_2$ with the logarithmic diode $D_1$ and capacitor $C_2$ located in its fedback branches is immediately capable of operating normally as a logarithmic stage. According to the invention, the run-up to the operating point occurs also in this case with a duration which is appropriate in relation to the switching time of the operational amplifier $OP_2$.

Figure 3:
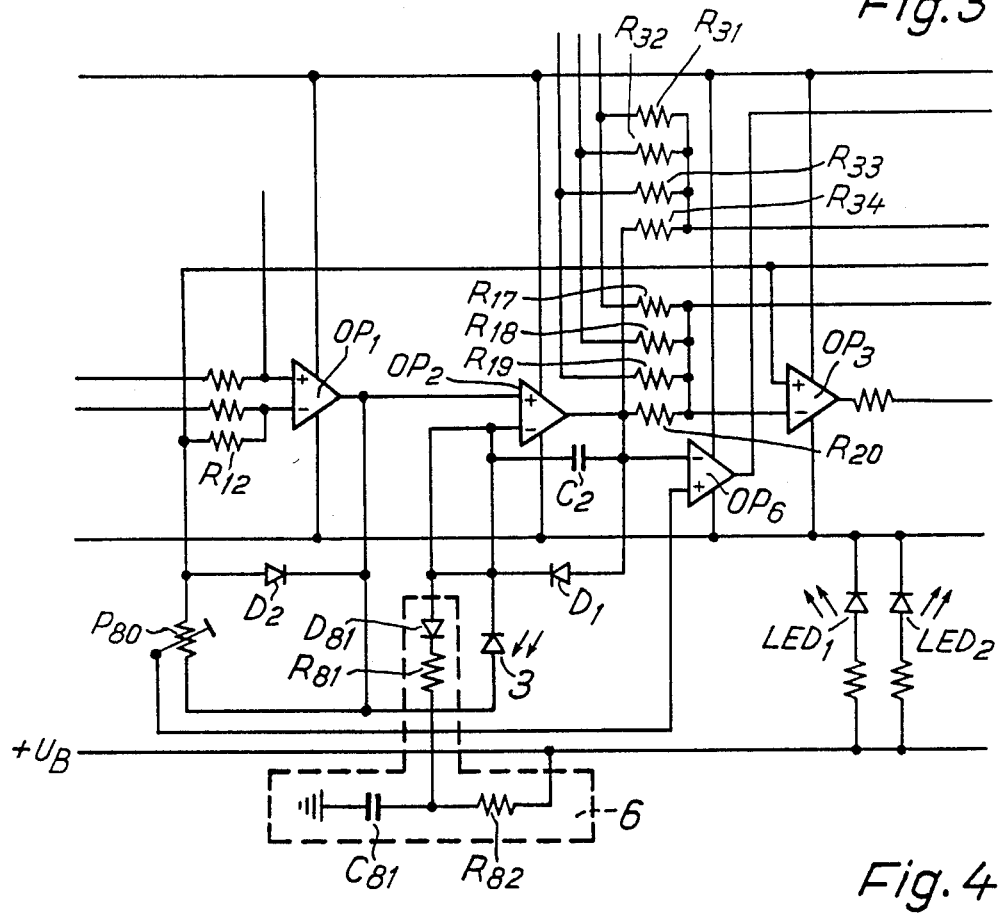

In the variant shown in FIG. 3, the voltage peak produced at the output of the opertional amplifier $OP_2$ when the operating voltage is switched on is not removed via short-circuiting. Instead, it flows off via a circuit section 6 which consists of a diode $D_{81}$, a resistor $R_{81}$, a capacitor $C_{81}$ and another resistor $R_{82}$ which precedes the capacitor and is connected to the operating voltage source and which is connected, in parallel with the photodiode 3, to the inverting input of the operational amplifier $OP_2$.

When the operating voltge is switched on, the false charge building up across the photodiode 3 during this process is removed via the diode $D_{81}$, the resistor $R_{81}$ and the capacitor $C_{81}$. If the capacitor $C_{81}$ has then charged up to operating voltage via the resistor $R_{82}$, the diode $D_{81}$ blocks and the operational amplifier $OP_2$ can start operating in its function as the logarithmic stage in conjunction with the diode $D_1$ and the capacitor $C_2$.

Figure 4:
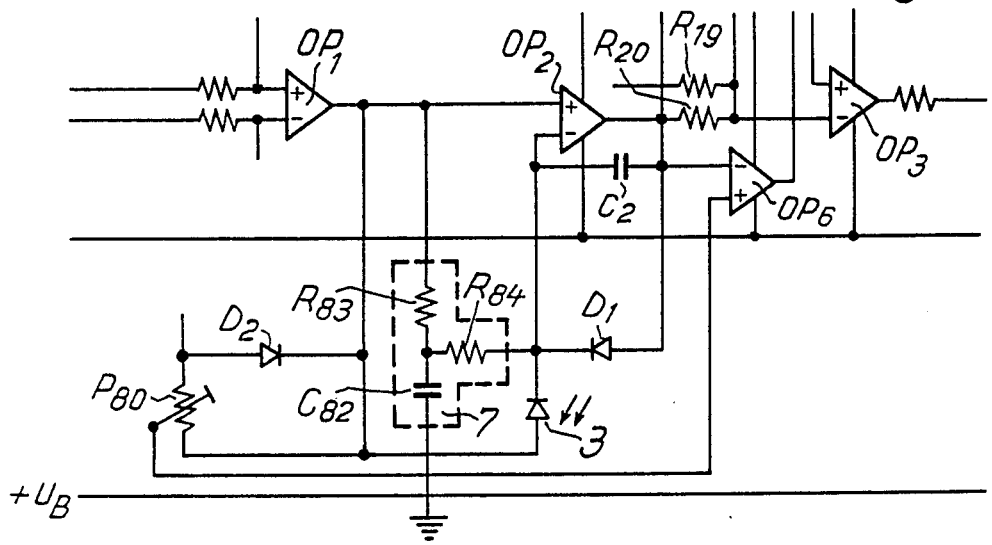

In the embodiment according to FIG. 4, the false charge ofthe photodiode 3 is removed by a circuit section 7 consisting of resistor $R_{84}$, capacitor $C_{82}$ and resistor $R_{83}$. The circuit section 7 is connected in parallel with the photodiode 3 and conncted to the non-inverting input of the operational amplifier $OP_2$.

The charge created in the photodiode 3 by the switch-on peak flows off via the resistor $R_{84}$ and the capacitor $C_{82}$ in this case. If the capacitor $C_{82}$ has become recharged after some time via the resistor $R_{83}$ and has reached the same potential as the non-inverting input of the operational amplifier $OP_2$, no further interfering current flows via the resistor $R_{84}$ since the inverting input of the operational amplifier $OP_2$ is then also at the same potential.

Figure 5:
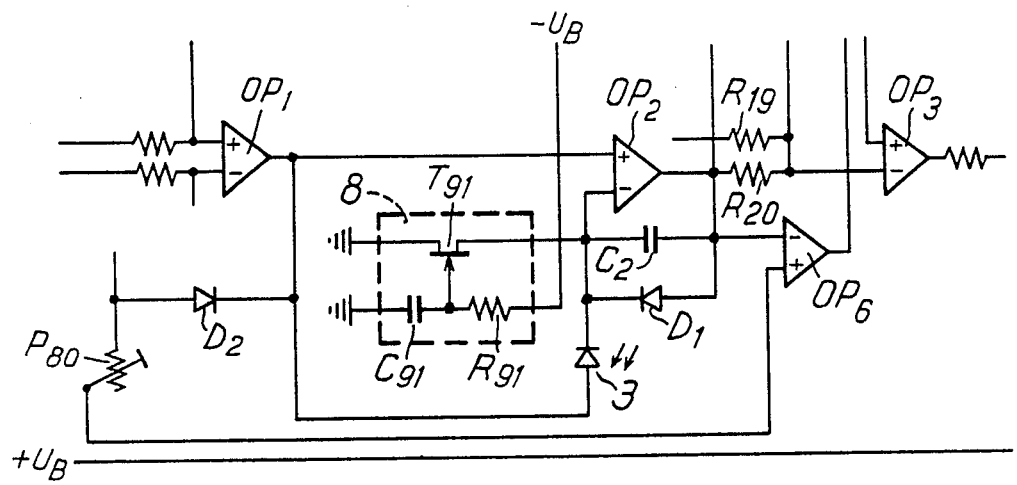

According to FIG. 5, a circuit section 8 used for removing the false charge ofthe photodiode 3, consists of a field effect transistor $T_{91}$ which is connected between photodiode 3 and non-inverting input of the operational amplifier $OP_2$. The control electrode of transistor $T_{91}$ is connected between a capacitor $C_{91}$, which is connected to ground, and a resistor $R_{91}$.

The interfering charge is removed by the field effect transistor $T_{91}$. This discharge phase is terminated after a time which is always constant and which is determined by resistor $R_{91}$ and capacitor $C_{91}$ (charging of the capacitor $C_{91}$ via resistor $R_{91}$ to the operating voltage). After the discharge phase is terminated, the fild effect transistor $T_{91}$ blocks the current flow so that then the photocurrent generated by the photodiode 3 and, corresponding to the amount of light incident on the photodiode, is supplied to the operational amplifier $OP_2$.

Figure 6:
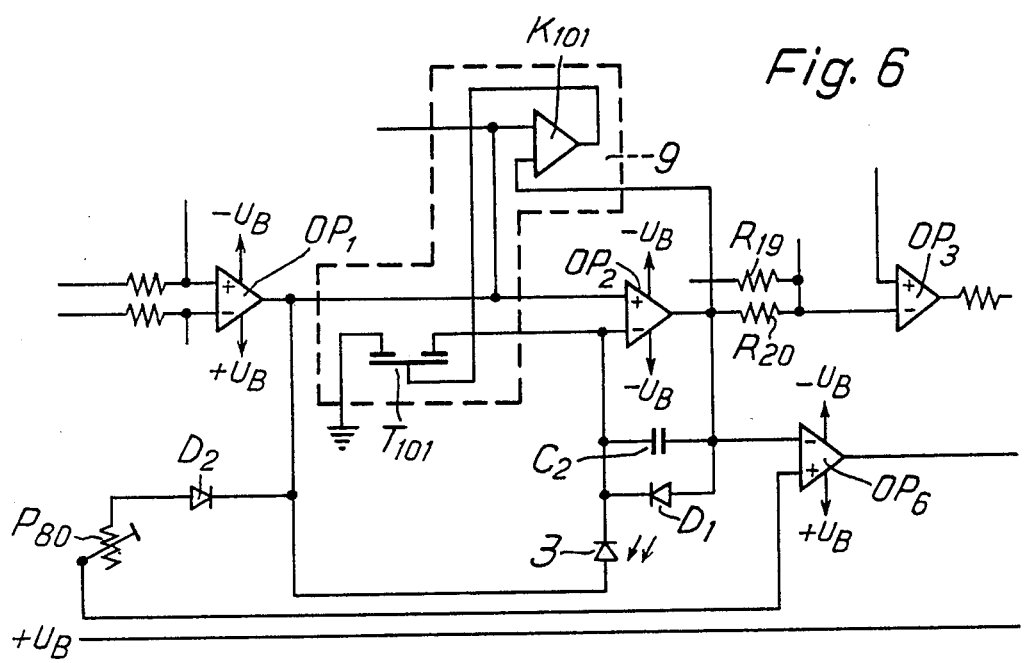

As a further circuit variant for removing the false charge of the photodiode 3, FIG. 6 shows a circuit section 9 which is placed between the output of the operational amplifier $OP_2$ and its inputs and which consists of a self-blocking field effct transistor $T_{101}$ and a comparator $K_{101}$. In this arrangement, the control electrode of the field effect $T_{101}$ is connected to the output of the comparator $K_{101}$ while its drain connection is connected to ground and its source connction is connected to the inverting input of the operational amplifier $OP_2$.

One of the inputs of the comparator $K_{101}$ is connected to the output of the operational amplifier $OP_2$ and the other is connected to its non-inverting input.

The interfering charge in the photodiode 3 produced in the circuit arrangement is removed by the self-blocking field effect transistor $T_{101}$ as long as the comparator $K_{101}$ finds that the output of the operational amplifier $OP_2$ has a lower potential than its non-inveting input.

Figure 7:
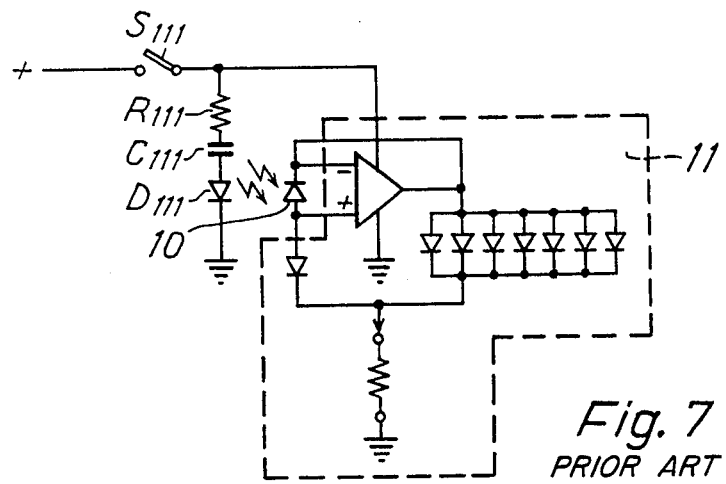
Figure 8:
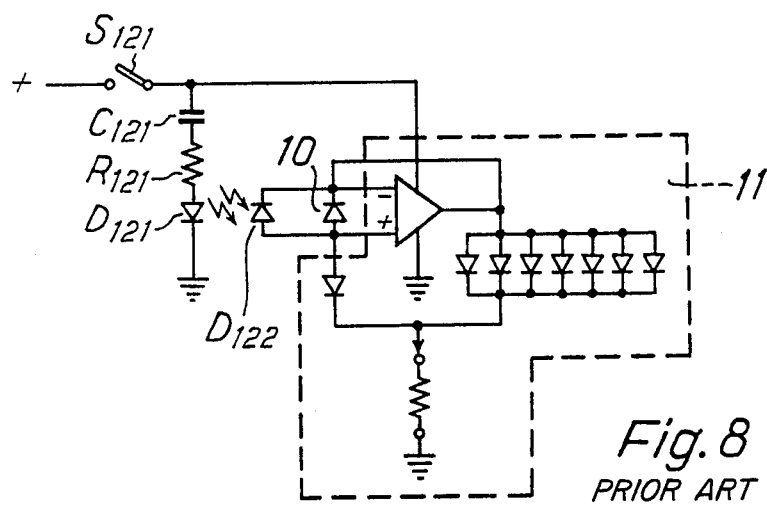
Figure 9:
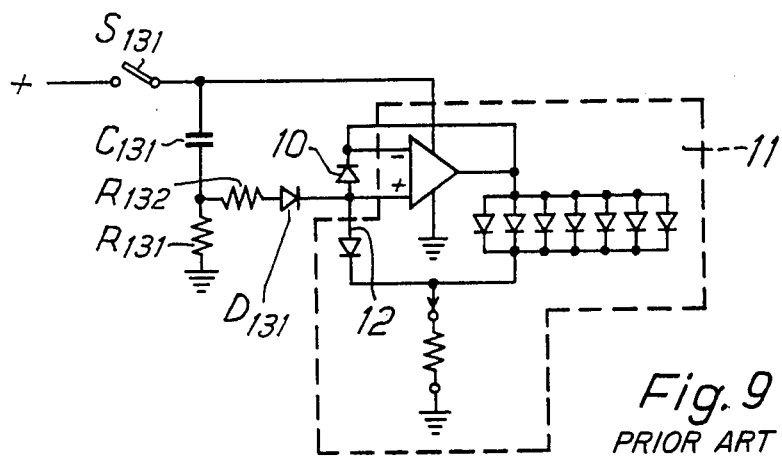

FIGS. 7-9 illustrate, in each case, an amplifier circuit 11 according to German Offenlegungsschrift No. 3,321,503. A photoiode 10 is connected between the inputs of an operational amplifier with fedback. When the current generated by the photodiodes is amplified, starting difficulties can occur. If this arrangement is used, for example, in conjunction with an automactic flash (measuring of the illumination during the flashing and automatic switching-off of the flash when the illumination is sufficient), the problem arises that, after the circuit arrangement is connected to the operating voltage, there is, before the flash is triggered, no light which can reach the photodiode 10 and can lead to an electric current flow. As a result, the operating point of the amplifier circuit 11 is not reached even slowly.

However, the flash, lasting only a few milliseconds, must also completely and correctly measured and processed further. That is to say here, too, the amplifier circuit must be prepared for a faultless operation by appropriate electronic control means.

FIG. 7 shows an illustrative embodiment of such a setting-up circuit. The photodiode 10 located between the inputs of the amplifier circuit 11 is here spatially associated with a light-emitting diode $D_{111}$. When the operating voltage is applied to the circuit arrangement, it is provided, by closing of a switch $S_{111}$, with a current pulse which is generated by an RC section consisting of resistor $R_{111}$ and capacitor $C_{111}$, which precedes it. This light pulse brings the amplifier circuit 11 into its operating range so that the electric signal resulting from the flash following briefly thereafter can be faultlessly processed.

A similar solution is shown in FIG. 8. Here, too, an RC section consisting of capacitor $C_{121}$ and resistor $R_{121}$ generates, when a swtich $S_{121}$ is closed, a current pulse as aresult of which a light-emitting diode $D_{121}$ following the RC section then emits a pulse of light. This pulse of light is converted by a photodiode $D_{122}$ connected together with a photodiode 10 into a voltage which allows the amplifier circuit 11 to settle into its operating range via the photodiode 10. The difference in the circuit arrangement shown in FIG. 8 from that of FIG. 7 consists in the fact that the light-emitting diode $D_{121}$ and the photodiode $D_{122}$ form an optocoupler in this case.

To allow the amplifier to settle into its operating range, a current pulse is fed to a line branch 12 coming from the anode of the photodiode 10 in the illustrative embodiment according to FIG. 9. When a switch $S_{131}$ is closed, this current pulse is generated by a capacitor $C_{131}$ and a resistor $R_{132}$ and passed to the line braanch 12 via a high-blocking capability diode $D_{131}$. If the capacitor $C_{131}$ has been recharged to ground potential by a resistor $R_{131}$ which is connected in series with it and is in turn connected to ground—which virtually means the termination ofthe settling time of the amplifier circuit 12 the diode $D_{131}$ blocks.

Figure 10:
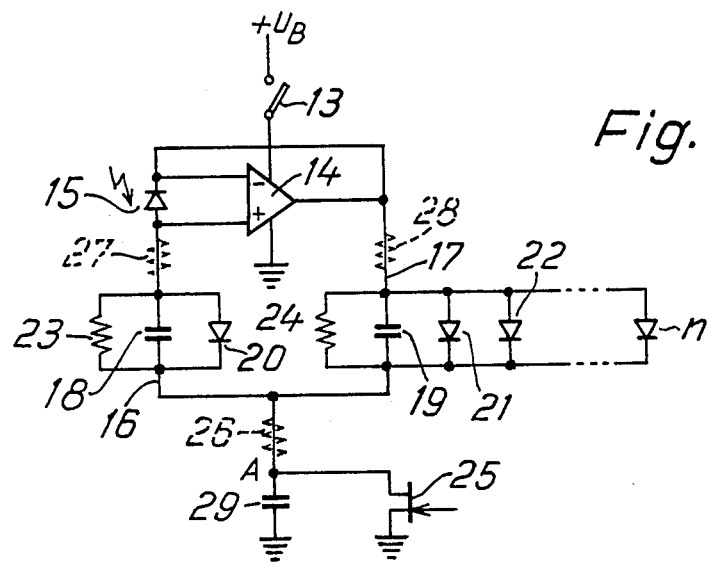

Finally, a circuit arrangement according to FIG. 10 is also possible. In the amplifier circuit shown in this figure, a voltage peak, occurring during switch-on ofthe operational amplifier 14 initiated by means of switch 13, can cause interference at a photodiode 15 located at the inputs of the operational amplifier as a result of which the non-inverting input of the operational amplifier 14 is kept from reaching the operating point. As a result, currents generated by pulse of light occurring for a brief time, for example flash lights, cannot be amplified.

To overcome this disadvantage, the amplifier modules consisting of capacitors 18 and 19 and diodes 20 and 21, 22 . . . n, located in branches 16 and 17 of the arrangement, are supplemented by parallel-connected resistors 23 and 24. These ensure that the non-inverting input of the operational amplifier 14 is discharged to the ground potential before the operating point. Since, as a result, both inputs of the operational amplifier 14 are in common mode, they are operationally ready at this potential.

This discharge takes place rapidly as long as a field effect transistor 25 connected to the sum point of branches 16 and 17 is conducting.

During the flash, the field effect transistor 25 does not become conductive so that the voltage emitted by the photodiode 15 due to the incident light of the flash can be properly processed.

Between the sum point of branches 16 and 17 and the field effect transistor 25 and in the line to the amplifier elements 18 to 24, resistors 26, 27 and 28 can be connected. They are used as protective resistors which attenuate disturbances which reach the line between the output A of the current amplifier and a capcitor 29 following it. In addition, they are capable of preventing the operational amplifier 14 from overshooting during switch-on.

What is claimed is:

1. A circuit comprisisng:
    (a) a logarithmic amplifier including at least
        (1) an operational amplifier having a first and second input, an output and a power supply connector, and
        (2) a non-linear circuit element connected between said output and said first input;
    (b) a photoelectric device connected between said first and second inputs;
    (c) a power source;
    (d) at least one switch connected between said power source and said power supply connector and providing a transient output voltage upon closing of said switch; and
    (e) control means connected between the output of said operational amplifier and to one of a reference voltage orsaid power supply connector for preventing false charging of said photoelectric device after closing of said switch.

2. A circuit as claimd in claim 1, wherein the control means enables the amplifier output slowly in relation to the switch-on time (slew rate) and briefly before the operating point of the amplifier is reached.

3. A circuit as claimed in claim 1, wherein the control means are further connected to an inverting input of the amplifier.

4. A circuit as claimed in claim 1, wherein said nonlinear circuit element comprises a logarithmic diode.

5. A circuit as claimed in claim 1, wherein the control means comprises a short-circuit switch ($T_{91}$).

6. A circuit arrangement as claimed in claim 1, wherein said control means comprises opto-electronic components.

7. A circuit as claimed in claim 6, wherein the opto-electronic component consists of an opto-coupler.

8. A circuit as claimed in claim 4, further comprising means for attenuating disturbances for avoiding overshoots, said alternating means comprising protective resistors.

9. A circuit as recited in claim 1 wherein the control means includes a diode and a capacitor connected in series, the diode electrically disconnecting the capacitor from said output after loading the capacitor.

10. A circuit as recited in claim 1 wherein the control means includes a diode and a capacitor connected in series, the diode electrically disconnecting the capacitor from said output after loading of the capacitor by means of an additional resistor connected to said power source.

11. A circuit as recited in claim 1 wherein said control means is additionally connected to said first input of said operational amplifier and said supply connector.

12. A circuit as recited in claim 11 wherein the control means comprises a high-blocking diode connected in series with a capacitor, said capacitor connected to said reference potential.

13. In a circuit having an amplifier and a photoelectric device connected to an input of the amplifier, a method of reducing settling time of the amplifier during switch-on of the amplifier comprising the step of preventing false charging of the photoelectric device during switch-on of the amplifier.

14. In a circuit having an amplifier and a photoelectric device connected to an input of the amplifier, a method of reducing settling time of the amplifier during switch-on of the amplifier comprising the step of discharging a false charge of the photoelectric device during switch-on of the amplifier.

* * * * *